United States Patent [19]

Cedrone

[11] Patent Number: 4,801,234

[45] Date of Patent: Jan. 31, 1989

[54] VACUUM PICK AND PLACE MECHANISM FOR INTEGRATED CIRCUIT TEST HANDLER

[75] Inventor: Nicholas J. Cedrone, Wellesley Hills, Mass.

[73] Assignee: Daymarc Corporation, Waltham, Mass.

[21] Appl. No.: 50,923

[22] Filed: May 15, 1987

[51] Int. Cl.⁴ .............................................. B65H 5/08
[52] U.S. Cl. ..................................... 414/224; 29/740; 29/759; 198/463.6; 198/346.2; 414/225; 414/752
[58] Field of Search ........... 414/224, 225, 752, 744 B; 198/346.2, 463.6, 531, 468.4, 468.8; 193/2 C; 29/740, 741, 759, 743; 324/158 F

[56] References Cited

U.S. PATENT DOCUMENTS

| | | | |
|---|---|---|---|
| 2,997,779 | 8/1961 | Smart | 29/741 |
| 4,501,527 | 2/1985 | Jacoby et al. | 414/744 B |
| 4,684,309 | 8/1987 | Horn | 198/346.2 X |

Primary Examiner—Leslie J. Paperner
Assistant Examiner—Donald W. Underwood
Attorney, Agent, or Firm—Wolf, Greenfield & Sacks

[57] ABSTRACT

In an automated high speed test handler for integrated circuits (IC's) an articulated vacuum picker reciprocates to transfer IC's successively from a staging area to a test site. Movable stops position and locate the IC at a test site. A sliding plate mounts the picker and carries cam surfaces to control the stops. A reciprocating placer mechanism carrying a multi-port vacuum manifold carries an IC being tested from the test site to a test plane displaced laterally from the flow path of the device. The picker is balanced to rotate under the weight of the IC being carried against mutually inclined lateral guide rails so that the mechanism is self-centering. These guide and locating mechanisms accurately position the IC so that there is no need for a physical steering of the IC's as they approach the test plane or a separately actuated clamping of the device in the test plane. After testing, the device is stripped from the vacuum manifold as the device encounters a guide plate on the return stroke of the placer mechanism.

9 Claims, 5 Drawing Sheets

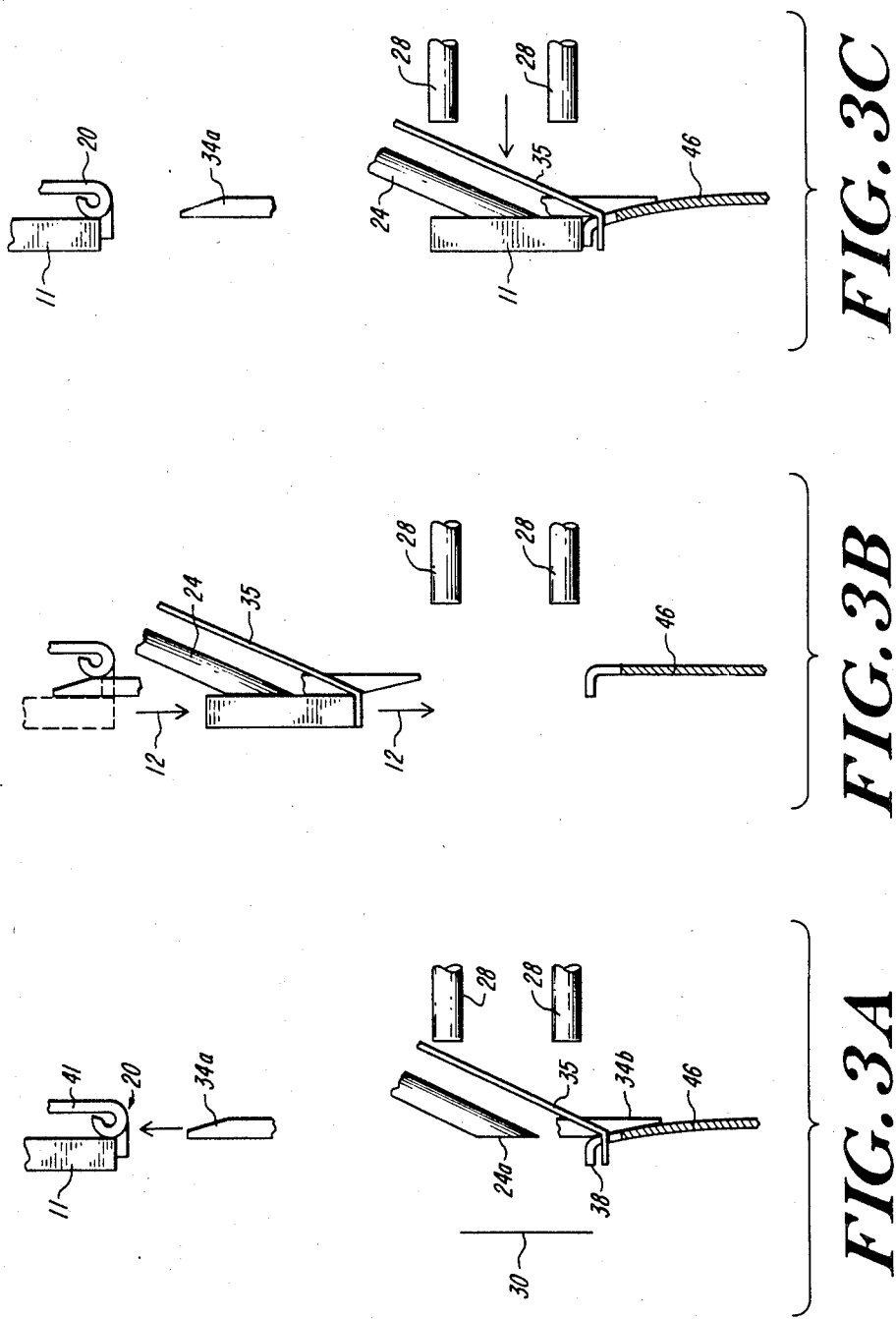

VACUUM PICK AND PLACE MECHANISM FOR INTEGRATED CIRCUIT TEST HANDLER

BACKGROUND OF THE INVENTION

This invention relates in general to transport apparatus for transferring discrete objects from one location to another with a high degree of accuracy. More specifically, it relates to a high speed, vacuum pick and place mechanism suitable for shuttling a succession of integrated circuits (IC's) to a well-defined position in a test plane offset from a main device flow path.

In the manufacture of IC's and the like it is important to test each circuit reliably and at a high throughput rate. Typically modern IC testers operate at rates in excess of 5,000 IC's per hour with each IC being tested in an interval of approximately 100 milliseconds. The IC's are generally stored and move in an end-to-end linear array.

These devices must move the IC's from this columnar array, one at a time, to a test site where they can be momentarily placed into electrical connection with a test circuit through a contactor assembly which acts as an electrical interface. The alignment problems are critical since the quality of the test depends on each lead making a good electrical connection with a single associated contact of the contactor assembly. In the testing of IC devices having a surface mount configuration (typically a square plastic body with leads on four sides and termed herein "SMD"), the handling problems have been accentuated by the presence of soft, readily-deformed leads on all four sides of a device (as opposed to earlier dual-in-line (DIP) packaged IC's with only two parallel rows of leads). It is also essential to a successful test handler that the operation of this transport be reliable, exhibit good wear characteristics, and accommodate IC's of different dimensions and configurations.

Conventional SMD IC testers typically allow the IC to drop under the influence of gravity to a test site level. The device is then advanced by one or more plungers to a test plane where the IC connects to a contactor assembly. Final positioning of the device is accomplished by camming the device using tapered side walls.

With this arrangement the camming surfaces apply side forces to the device which for at least some products, e.g. PCC packaged devices, can cause the bending of leads. Side wall camming can also result in a transfer of conductive material from the leads to the cam surfaces which in turn can develop into leakage paths that degrade the testing. Another problem with a "closed" system established by the tapered side walls is that the side walls and the devices must meet close dimensional tolerances to produce the desired steering of the device while avoiding lead damage or a jamming of the device. Stated in other words, this approach is not tolerant of variations in the dimensions of the product. This system is also intolerant of error in positioning the device at the test site. An incorrectly positioned device can damage the device or the machine when it is driven by the plunger or plungers.

Horizontal pick and place systems are known, principally in Japan, for testing quad surface mount IC's. These test devices use a convention pick and place system where a picker raises a device, moves it horizontally to a position over a test site, lowers it, and then returns to pick up another device. In end result the device moves in a horizontal plane. At the test site four separately actuated mechanisms then clamp the leads to contacts. Another mechanism then removes the device from the test site after it is tested. This arrangement is comparatively mechanically complex, relatively slow, and it is not readily adapted to a variety of package configurations and dimensions.

It is therefore a principal object of this invention to provide a mechanism for reliably and rapidly transporting a succession of IC's, particularly SMD IC's, that provides a reliable alignment with a contractor and which substantially eliminates physical contact with the leads which could deform them.

Another principal object is to provide a transport mechanism with the foregoing advantages that readily accommodates IC's of varying dimensions and configurations.

A further object is to provide a transport mechanism with the foregoing advantages which does not require critical tolerances on steering surfaces and which is substantially less prone to jamming of the devices than prior art mechanisms.

Another object is to provide a transport mechanism which both shuttles devices to a test site and places them in electrical connection with a test circuit without additional clamping mechanisms.

A still further object is to provide a transport mechanism with the foregoing advantages which does not create current leakage paths near the test area through the transfer of conductive material from the leads to guide surfaces.

SUMMARY OF THE INVENTION

A mechanism for reliably transporting IC devices: first, along a product flow path from a staging area to a test site; second, from the test site to a test plane offset from the flow path; and third, returning them to the flow path at the test site for further movement, preferably under the influence of gravity. In a preferred form the mechanism is built around a guide plate which mounts a slide reciprocally movable between a pick position at the staging area and a place position at the test site. The slide, in turn, pivotally mounts a vacuum pick that has a free end adapted to grip the lead IC in a linear array.

The pick is balanced so that it pivots under the weight of a gripped IC to place the IC in the flow path. The guide also plate mounts a pair of lateral guide rails which are preferably mutually inclined so that, in combination with a light vacuum grip by the picker, the IC being transported is self-centering during transport to the test site without physical contact with the leads. The IC engaging surfaces of the lateral guides are also preferably tapered to accept IC's of varying dimensions and facilitate the proper orientation of the IC during its movement to the test site. Spring loaded stops locate and orient the IC when the slide is in its pick and place positions. The pick and slide also preferably carry an elevator stop that assists the pick in supporting the IC during its movement to the test site.

A linear actuator supports a multi-port vacuum manifold which grips the IC being tested securely when it is positioned at the test site. The actuator drives the IC to a test plane along a direction generally perpendicular to the flow path. The shuttle mechanism carrying the IC is spaced fully from the sides of the perimeter of the IC at the test site so that nothing constrains the movement of the IC to the test plane, such as the steering surfaces of prior art devices. The alignment of the IC being tested is set by the upper stop, the lateral guide rails, the guide plate, the action of the articulated pick, and then the lower stop. The vacuum manifold is sufficiently strong to maintain the alignment of the IC during its transport to the contactor. The vertical position of the IC under test is readily adjusted to accommodate different size IC's by adjusting the position of the lower stop. The linear actuator preferably includes annular springs to absorb the shock of the impact as the actuator reaches its limit position which is adjustable by nuts threaded on the actuator frame. A coil spring or the like returns the actuator rod, the vacuum manifold and the tested IC to the product flow path. On the return the IC strikes the guide plate to strip it from the manifold. The gravitational forces overcome the vacuum grip as the device is stabilized on the rails so that it falls in a stable orientation.

The staging area has a cover spaced from the guide rails a distance determined by the thickness of the IC being tested. The upper stop is preferably a spring clip mounted on a spring plate where the clip extends into the product flow path a sufficient distance to engage the body of the IC under test, not its leads. An adjustment screw varies the rail-to-cover spacing for IC's of different thicknesses. The upper stop is positioned so that the IC leads will not impact on the upper stop.

These and other features and objects of the invention will be more fully understood from the detailed description which should be read in light of the accompanying drawings.

BRIEF DESCRIPTION OF THE DRAWINGS

FIGS. 3A–3E are simplified views of the mechanisms for controlling the movement of an IC under control of the transport mechanism shown in FIGS. 1 and 2 through a progressive movement of the device from a staying area, through testing, to discharge back into a main product flow path.

DETAILED DESCRIPTION OF THE PREFERRED EMBODIMENTS

Figure 1:
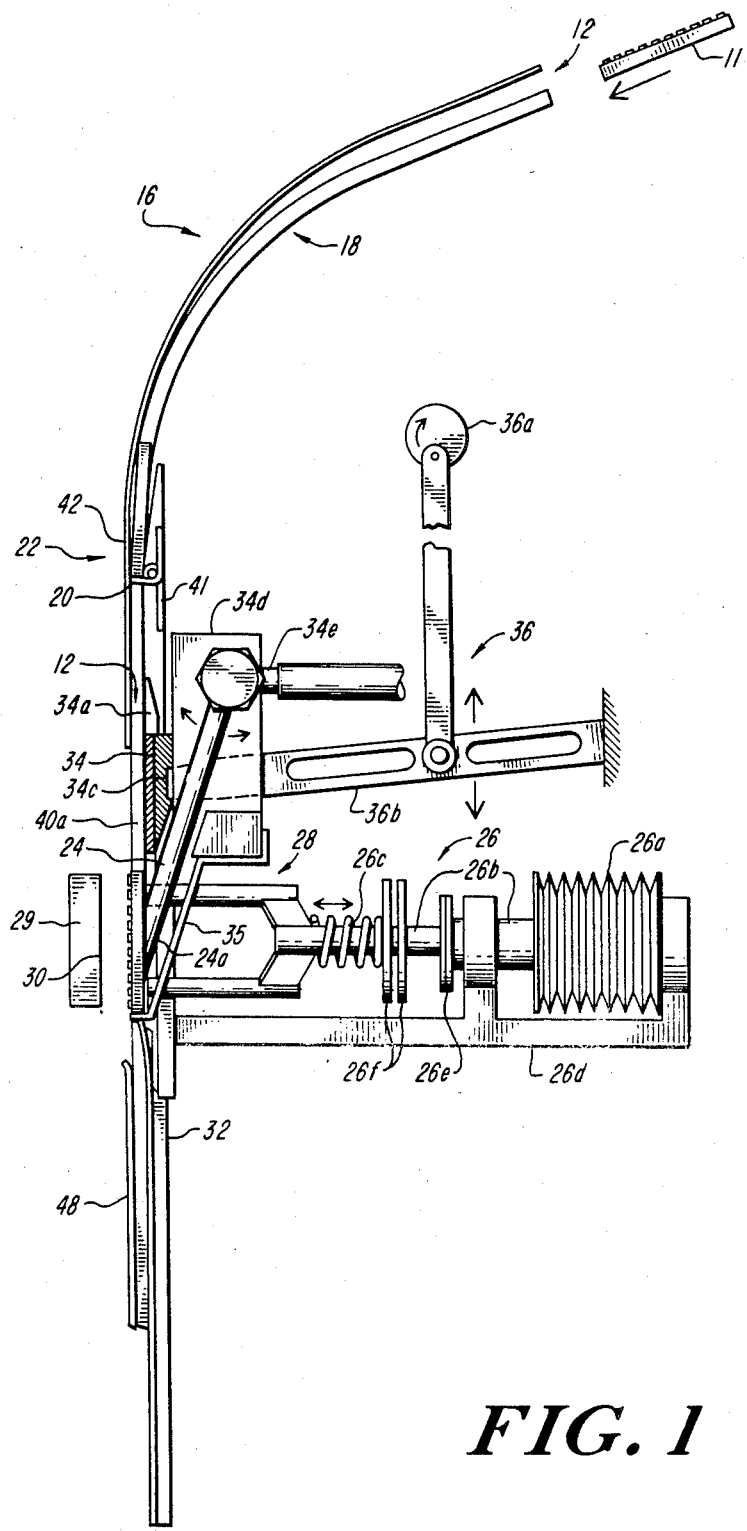
FIG. 1 is a view in vertical section of a transport mechanism accordint to the present invention.
Figure 2:
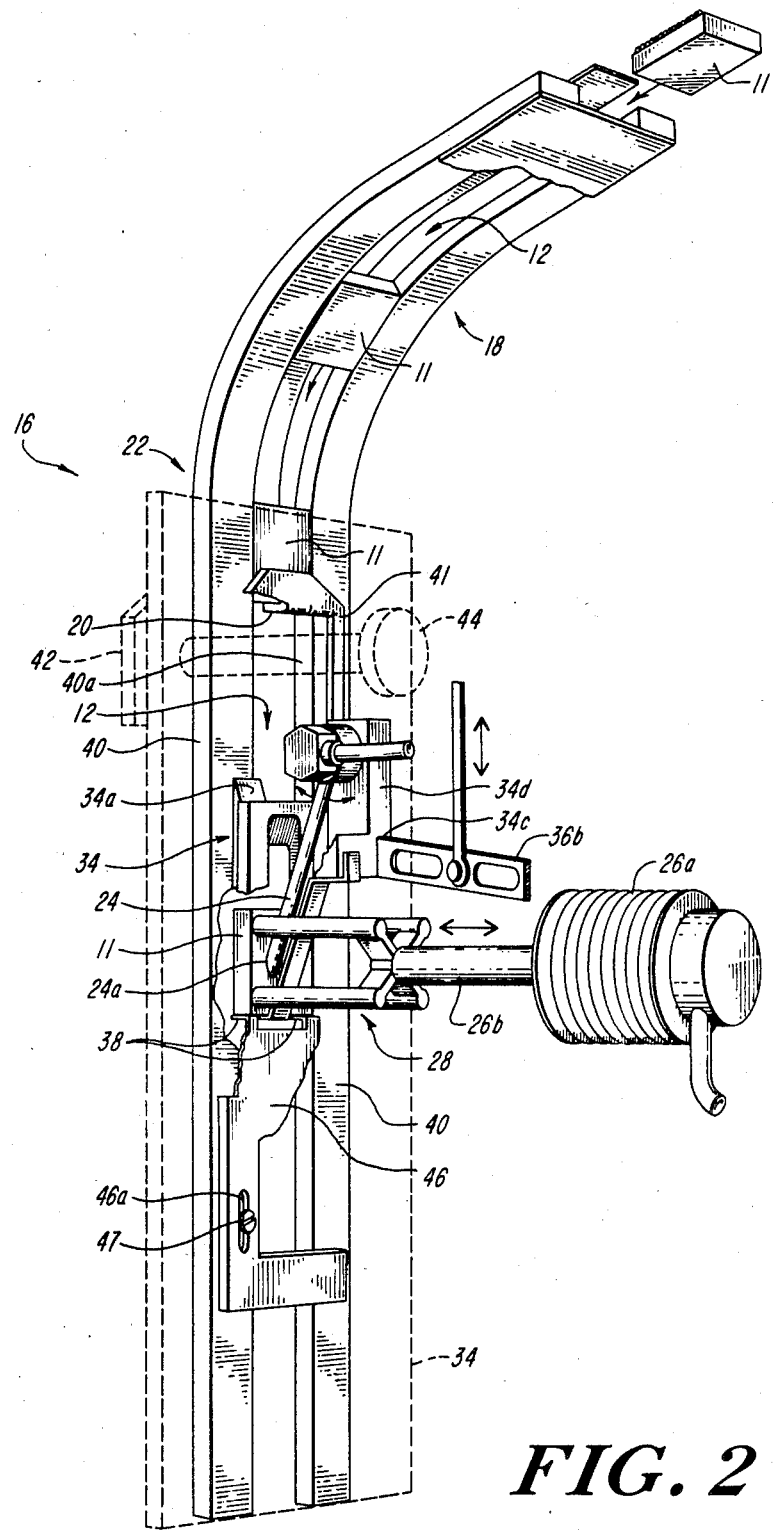
FIG. 2 is a perspective view of the transport mechanism shown in FIG. 1.
Figure 3E:
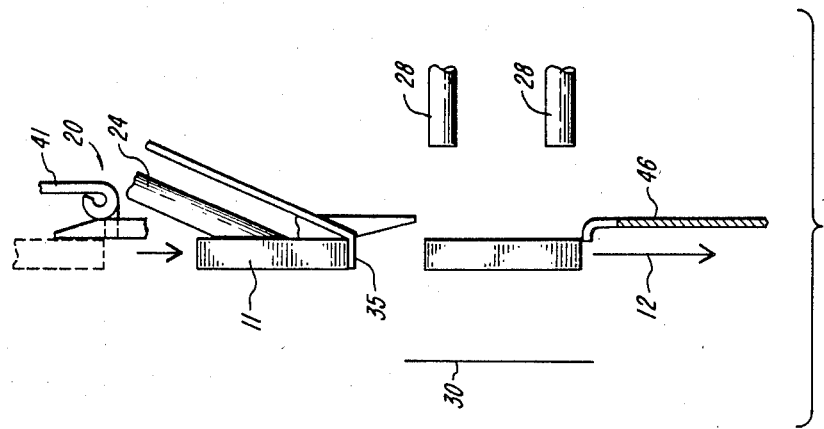
Figure 3D:
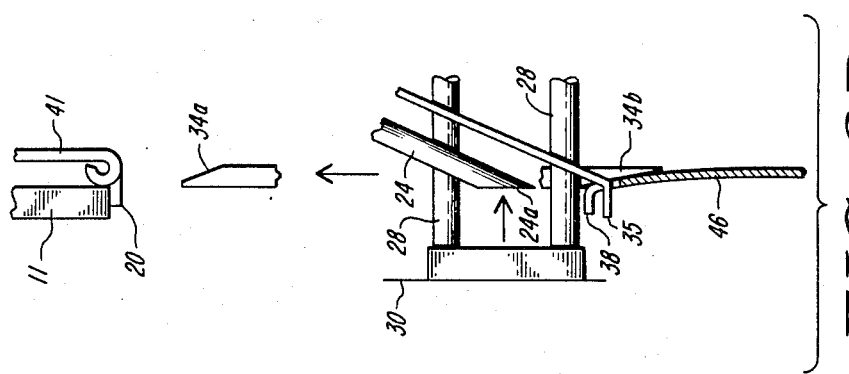
Figure 4:
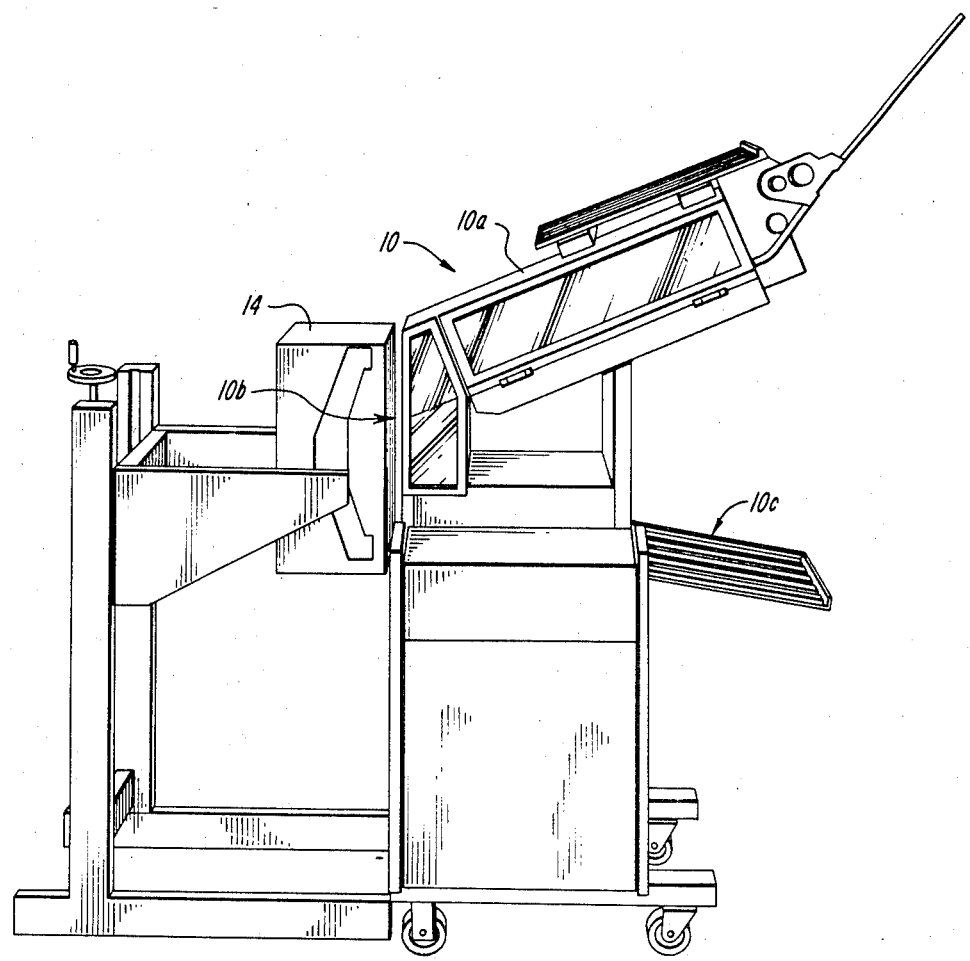
FIG. 4 is a perspective view of an automated, high speed test handler according to the present invention.
Figure 5:
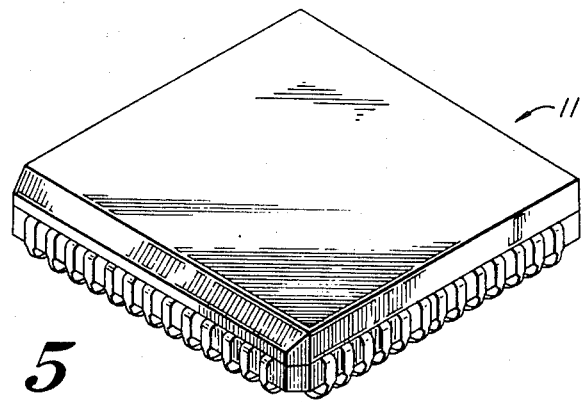
FIG. 5 is a perspective view of an SMD IC which is transported and tested by the apparatus shown in FIGS. 1–4.

FIG. 4 shows a high speed test handler 10 for integrated circuits (IC'of the type sold by Daymarc Corporation as its Model 757. It can test IC's of the dual-in-line (DIP) or surface mount (SMD) configuration (FIG. 5). A flow of IC's in end-to-end linear array are directed from a storage and heat chamber 10a, along a product flow path 12, to a test site 10b. After testing, the IC's are directed to one of several bins 10c depending on the results of the test. A test circuit 14 is connected electrically to the contactor, and through the contactor to an IC device under test (DUT) which is located at the test site and then placed into a position where its leads are each in electrical connection with one contact of the contactor assembly.

FIGS. 1–3E show an IC transport mechanism 16 according to the present invention which receives a succession of IC's, particularly SMD IC's from a track section 18 which directs the devices from the chamber 10a toward the transport mechanism 16. In general, the IC's are stacked in line in the track 18 with a first IC (hereinafter the "IC" or "DUT") held on an upper stop 20 at a staging area 22. The DUT is carried by a vacuum pick 24 and an elevator stop 35 from the staging area to the test site 10b where a placer sub-assembly 26, also termed a probe drive, grips the DUT with a multi-port vacuum manifold 28 secured to one end of a linear actuator, as shown, an air bellows 26a which drives a multi-section shaft 26b and the manifold 28 against the action of a return coil spring 26c. These elements are supported by a frame 26d. The actuator drives the gripped DUT from the flow path 12 to a test plane 30 where the leads make electrical connection with associated contacts of a contactor assembly 29 shown schematically.

The transport mechanism is organized on a guide plate 32 having a central recess that receives and guides a generally H-shaped slide 34 which carries a highly wear resistant cam surfaces 34a and 34b at the upper and lower ends of the slide, respectively. The slide is mounted for a vertical reciprocating motion. A drive 36 for the slide includes a rotating wheel 36a with an eccentric coupling to a lever arm 36b whose free end is replaceably coupled to a mating recess 34c of the slide. Rotation of the disc 36a by a conventional electric motor or the like causes the lever arm, and hence the slide, to move in a vertical reciprocating motion.

The pick 24 is pivotally mounted on the slide 34 in a mount assembly 34d which also connects the pick to a port 34e that connects to a suitable, conventional vacuum source. The pick is positioned so that when the slide is in its upper or "pick" limit position, the free end 24a of the pick is positioned to couple and grip the top surface of the lead IC held on the stop 20. The articulation of the pick allows it to rotate under the influence of the vacuum to move to the gripping position without the maintenance of tight dimensional tolerances on clearances. At the same time, the "elevator" stop 35 also secured on the assembly 34 has a free end positioned to support and stabilize the IC after it bears most of the weight of the IC. The portion of the stop which projects into the product flow path is narrow so that it passes freely between the spaced apart free ends of a lower stop 38 when they are positioned in the flow path. In the lower or "place" limit position, the DUT engages and is located and oriented on the lower stop 38. Preferably the DUT body, not its leads, engage the stop 38 before the slide reaches its extreme limit position so that the pick, which is lightly coupled to the DUT, continues to urge the DUT onto the stop 38 to ensure the DUT is properly aligned with respect to the contact or assembly. The pick remains in a vacuum grip with the DUT, while the placer mechanism 26 and the vacuum manifold 28 also establish a grip to ensure a continuous positive control over the position of the DUT at the test site. The weight of the DUT coupled to the pick rotates the pick counterclockwise, as shown, to place the body of the DUT, not its leads, into contact with the beveled, outwardly facing surfaces 40a, 40a of a pair of lateral guide rails, 40, 40 mounted on the guide plate 32. The guide rails are also preferably mutually inclined to narrow slightly in a downward direction, as shown, towards the test site. As a result, as the pick moves toward the test site carrying the DUT, the guide rails, in cooperation with a light, single point grip of the pick on the DUT, allows the DUT to automatically center itself laterally.

A cover plate 42 is spaced from the rails 40, 40 at the staging area by the thickness of the IC's being processed. An adjustment screw 44 acts against the plate 42 to vary the rail to cover spacing to accommodate IC's of different thicknesses. A spring plate 41 is mounted on gibs secured to the guide plate with the upper stop 20 mounted at its free end. The spring plate is positioned with respect to the slide so that the cam surfaces 34a of of the slide 34 engage and displace the free end. This moves the stop out of the flow path so that the lead IC can move downwardly onto the elevator stop and under control of the pick 24 and the slide.

Similarly the lower stop 38 is formed as an angled end portion of a spring plate 46 secured at its lower end to the guide plate 32 by screws 47 received in elongated openings 46a in the plate to provide a vertical adjustment of the stop. In its relaxed state, the stop 38 is clear of the flow path 12. When the slide is in its lower limit position, the cam surfaces 34b drive the upper free end of the spring plate to a position where the stop is interposed in the flow path to receive the DUT. As noted above, the stop is formed with two spaced apart DUT-engaging portions to allow the elevator stop to pass through the clearance and to provide a more stable support for the DUT. When the slide 34 and the pick 24 move back toward the upper pick position to transport the next IC, the stop moves out of the flow path under the spring force of the plate 46.

The placer mechanism in its preferred form utilizes multiple vacuum ports, four as shown, distributed generally symmetrically with respect to the DUT top surface and generating a sufficient vacuum grip on the DUT to secure its spatial location through the movement to the test plane and the connection to the contactor assembly. The application of the vacuum grip to the DUT is coordinated with the movement of the pick 24 and the slide 34 so that the DUT is gripped by the manifold once it is reliably seated, and thereby located on the stop 38. The pick continues to grip the DUT to provide a continuity of gripping control. The path of movement of the manifold, is generally perpendicular to the direction of the movement of the DUT along the flow path under control of the pick. The placer mechanism also includes stiff annular springs 26e which absorb the shock generated by the actuator as it reaches its extreme travel limit coincident with the DUT being positioned at the test plane in electrical connection with the contactor assembly. A pair of nuts 26f threaded on a portion of the shaft 26b adjustably set the amount of travel of the placer mechanism.

It is significant that the transport mechanism 16 is constructed so that there is a clear perimeter around a DUT when it is at the test site and ready for movement to the test plane. This avoids lead contact with fixed surfaces which could distort them or otherwise degrade the test results. During vertical movement, the picker grips the DUT from its top surface with the leads projecting toward the test plane; guiding contact is made only at the surfaces 40a, 40a of guide rails 40, 40, acting on top edges of the body of the DUT, opposite the leads. Except for the cover 42, and a lower cover 48 below the test site, the device is therefore gripped and guided only from one side, leaving the leads totally unobstructed in the direction of the test plane.

In operation the IC in the track section 18 rests on stop 20 until it is cammed away by cam surface 34a to release the IC causing it to fall under the influence of gravity onto the elevator stop 35 with the vacuum pick lightly attached to its upper face opposite the leads. The pick then moves downwardly causing the stop 20 to re-enter the product flow path 12 to hold the next IC at the staging area. The stop elevator and pick carry the IC downwardly until it comes into contact with the lower stop 38. Continued downward movement of the pick and stop 35 ensure that the IC is aligned and located on the lower stop. The vertical position and the orientation of the IC at the test site are therefore set principally by the lower stop. The pick interacting with the beveled surfaces 40a of the mutually inclined guide rails 40 position the IC at the test site laterally. The placer mechanism 26 then grips the IC tightly and carries it in a lateral direction to a test plane where it is placed in electrical connection with the contactor assembly. There is no physical contact between the IC device or its leads with a steering surface during this lateral movement. After the test is completed, the placer mechanism returns to its initial position under the influence of the spring 26d. During this return movement, the device strikes the guide plate and is stripped from the vacuum manifold. It has been found that this stripping arrangement, whether due to the continued, albeit diminished, influence of the vacuum grip immediately after the stripping begins, stabilizes the IC on the rails so that it falls in a controlled manner down the flow path 12 after it is stripped.

There has been described a transport mechanism for discrete objects, particularly SMD IC's, which rapidly and reliably carried the IC's from a staging area to a test site and then a test plane without a mechanical steering or guiding of the leads, but with a very accurate control over the physical location of the IC, particularly at the test site and during the movement to the test plane. These advantages are also provided with a transport mechanism that readily adjusts to IC's of varying size or configuration. Other than the transport mechanism itself, no other activators are necessary to clamp or otherwise connect the leads to contacts at the test plane. The transport mechanism described above is also highly resistant to jamming of IC's in the mechanism which can damage the IC or the mechanism.

While this invention has been described with respect to its preferred embodiments, it will be understood that various alterations and modifications will occur to those skilled in the art from the foregoing detailed description and the drawings. For example, the picker could have multiple ports or a non-pivoting mounting, the placer mechanism could have any of a variety of drives, and the escapement mechanism provided by the stops and cams could be accomplished by a variety of other mechanical or electro-mechanical techniques. Also, while the invention has been described with respect to a vertical picking movement under control of the pick 24 in cooperation with the guide rails and stops, it will be understood that the invention is not limited to a vertical movement and could include, for example, movement along an inclined, or even a horizontal, direction. These and other variations and modifications are intended to fall under the scope of the accompanying claims.

What is claimed is:

1. A mechanism for transporting at a high speed a succession of integrated circuits (IC's) which are movable in a guide track section along a product flow path from a staging area to a test site that is displaced horizontally from a test plane along a first direction transverse to said flow path, comprising:
- lateral guide means extending from said staging area to said test site,
- a slide member movable in a reciprocating manner along said lateral guide means between a pick position at said staging area and a place position at said test site,
- a pick mounted on said slide member adapted to vacuum grip an IC at said staging area and carry it to said test site in coordination with a corresponding movement of said slide member,
- means for driving said slide member and pick between said pick and place positions, and
- means for driving said IC along said first direction between said place position and a test position,
- said pick gripping said IC sufficiently lightly to allow changes in orientation of the device with respect to the pick, said pick being mounted on said slide member for an articulated movement, and said lateral guide means being mutually inclined rails to self-center said IC as it moves from the staging area to the test site.

2. The transport mechanism of claim 1 further comprising,
- means for holding said IC at said pick position,
- means for locating said IC at said test site after it is transported by said vacuum pick,
- means for disengaging said holding means when said frame is in its pick position to allow the transport of said IC, and
- means for engaging said locating means when said frame is in its place position.

3. The transport mechanism of claim 2 wherein said holding means comprises a stop that is spring biased to extend into the product flow path.

4. The transport mechanism of claim 2 where said locating means comprises a stop spring biased to extend into the product flow path.

5. The transport mechanism of claim 2 wherein said disengaging means and said engaging means both compromise cam surfaces on said slide member.

6. The transport mechanism of claim 1 wherein said driving means comprises a vacuum manifold, a linear actuator which mounts and drives said vacuum manifold and the IC device gripped on said vacuum manifold, from said place position to said test plane, and means urging said actuator in the opposite direction.

7. The transport mechanism of claim 7 wherein said vacuum manifold has a plurality of vacuum ports arranged with respect to said device to secure the orientation of device during said movement along said first direction.

8. The transport mechanism of claim 1 further comprising a cover plate adjacent said staging area and means for translating said cover plate along said first direction with respect to said lateral guide means to accommodate devices with varying thicknesses whereby only the body of the IC encounters said holding means.

9. A mechanism for transporting at a high speed a succession of integrated circuits (IC's) which are movable in a guide track section along a product flow path from a staging area to a test site that is displaced horizontally from a test plane along a first direction transverse to said flow path, comprising:
- lateral guide means extending from said staging area to said test site,
- a slide member movable in a reciprocating manner along said lateral guide means between a pick position at said staging area and a place position at said test site,
- a pick mounted on said slide member adapted to vacuum grip an IC at said staging area and carry it to said test site in coordination with a corresponding movement of said slide member,
- means for driving said slide member and pick between said pick and place positions,
- means for driving said IC along said first direction between said place position and a test position,
- a first stop spring biased to extend into the product flow path to hold said IC at said pick position,
- a second stop spring biased to extend into the product flow path to locate said IC at said test site after it is transported by said vacuum pick, and
- cam surfaces on said slide member that disengage said holding means when said frame is in its pick position to allow the transport of said IC and engage said locating means when said frame is in its place position.

* * * * *